(12) United States Patent
Sakakibara et al.

(10) Patent No.: US 10,903,138 B2
(45) Date of Patent: Jan. 26, 2021

(54) SEMICONDUCTOR DEVICE AND METHOD OF MANUFACTURING THE SAME

(71) Applicant: DENSO CORPORATION, Aichi-pref (JP)

(72) Inventors: Akinori Sakakibara, Toyota (JP); Takanori Kawashima, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/693,772

(22) Filed: Nov. 25, 2019

(65) Prior Publication Data
US 2020/0203253 A1 Jun. 25, 2020

(30) Foreign Application Priority Data
Dec. 21, 2018 (JP) .................................. 2018-239949

(51) Int. Cl.
*H01L 23/373* (2006.01)
*H01L 21/48* (2006.01)

(52) U.S. Cl.
CPC ...... *H01L 23/3735* (2013.01); *H01L 21/4882* (2013.01)

(58) Field of Classification Search
CPC .................. H01L 23/3735; H01L 21/4882
See application file for complete search history.

(56) References Cited

U.S. PATENT DOCUMENTS

| 10,002,821 | B1* | 6/2018 | Hoegerl | ............... H01L 23/4334 |
| 2014/0167237 | A1* | 6/2014 | Yoo | ....................... H01L 23/053 |
| | | | | 257/676 |

FOREIGN PATENT DOCUMENTS

JP 05-343591 A 12/1993

* cited by examiner

*Primary Examiner* — Peniel M Gumedzoe
(74) *Attorney, Agent, or Firm* — Sughrue Mion, PLLC

(57) ABSTRACT

A semiconductor device includes a substrate constituted of an insulator, a first conductor film provided on a surface of the substrate; a semiconductor chip including a first electrode and a second electrode, the first electrode being connected to the first conductor film; and an external connection terminal including an inner end portion and an outer end portion. The inner end portion is located between the substrate and the semiconductor chip and is connected to the second electrode. The external connection terminal further includes an intermediate portion located between the inner end portion and the outer end portion and joined to the surface of the substrate. A distance between the intermediate portion of the external connection terminal and the substrate is greater than a distance between the inner end portion of the external connection terminal and the substrate.

11 Claims, 5 Drawing Sheets

SEMICONDUCTOR DEVICE AND METHOD OF MANUFACTURING THE SAME

CROSS-REFERENCE TO RELATED APPLICATION

This application claims priority to Japanese Patent Application No. 2018-239949, filed on Dec. 21, 2018, the entire contents of which are incorporated herein by reference.

TECHNICAL FIELD

The technology disclosed herein relates to a semiconductor device and a method of manufacturing the same.

BACKGROUND

Japanese Patent Application Publication No. H05-343591 describes a semiconductor device. This semiconductor device includes a ceramic substrate, a semiconductor chip disposed on the ceramic substrate, and an external connection terminal joined onto the substrate at a location separated from the semiconductor chip. The external connection terminal is electrically connected to the semiconductor chip via a conductor film (a conductor wiring pattern) provided on the ceramic substrate and a bonding wire.

SUMMARY

In the above-described semiconductor device, if the external connection terminal and the semiconductor chip are directly connected to each other without the conductor film and the bonding wire, the semiconductor device could be downsized. However, if the external connection terminal and the semiconductor chip are directly connected (or they are connected via a small spacer or the like), external force applied to the external connection terminal would easily be transferred to the semiconductor chip through the external connection terminal, and the semiconductor chip (or a connecting portion between the external connection terminal and the semiconductor chip) may be damaged. The present disclosure provides a technology capable of mitigating or solving such a problem.

A semiconductor device disclosed herein may include: a substrate constituted of an insulator; a first conductor film provided on a surface of the substrate; a semiconductor chip including a first electrode and a second electrode, the first electrode being connected to the first conductor film; and an external connection terminal including an inner end portion and an outer end portion, the inner end portion being located between the substrate and the semiconductor chip and being connected to the second electrode. The external connection terminal may further include an intermediate portion, the intermediate portion being located between the inner end portion and the outer end portion and being joined to the surface of the substrate. A distance between the intermediate portion of the external connection terminal and the substrate may be greater than a distance between the inner end portion of the external connection terminal and the substrate.

In the above-described semiconductor device, the inner end portion of the external connection terminal is located between the substrate and the semiconductor chip. The inner end portion of the external connection terminal can therefore be connected to the second electrode of the semiconductor chip directly (or via a small spacer or the like), and the semiconductor device can thereby be downsized. Moreover, the intermediate portion of the external connection terminal is joined to the surface of the substrate. According to such a configuration, even when external force is applied to the outer end portion of the external connection terminal, the external force is less likely to be transferred to the inner end portion of the external connection terminal, by which damage to the semiconductor chip can be avoided or suppressed, for example.

In addition, the distance between the intermediate portion of the external connection terminal and the substrate is greater than the distance between the inner end portion of the external connection terminal and the substrate. Such a relatively great distance between the intermediate portion of the external connection terminal and the substrate facilitates designing of a structure for joining the intermediate portion and the substrate to each other, by which they can be joined with sufficient strength. On the other hand, since the inner end portion of the external connection terminal is located between the substrate and the semiconductor chip, the relatively small distance between the inner end portion and the substrate enables downsizing of the semiconductor device.

The present disclosure also discloses a method of manufacturing a semiconductor device. This manufacturing method enables manufacturing of; for example, the above-described semiconductor device. This manufacturing method may include: connecting an inner end portion of an external connection terminal to a second electrode of a semiconductor chip; and connecting a first conductor film provided on a surface of a substrate constituted of an insulator to a first electrode of the semiconductor chip and simultaneously joining the surface of the substrate to an intermediate portion located between the inner end portion and an outer end portion of the external connection terminal. The inner end portion of the external connection terminal connected to the second electrode may be located between the substrate and the semiconductor chip, and a distance between the intermediate portion of the external connection terminal and the substrate may be greater than a distance between the inner end portion of the external connection terminal and the substrate.

In the above-described manufacturing method, when the inner end portion of the external connection terminal is connected to the second electrode of the semiconductor chip, neither the conductor film of the substrate nor a bonding wire needs to be interposed therebetween, by which the semiconductor chip and the external connection terminal can be aligned directly. This enables accurate manufacturing of the semiconductor device. In general, downsizing of a semiconductor device requires higher manufacturing accuracy. According to this manufacturing method, such a semiconductor device can be manufactured relatively easily.

DETAILED DESCRIPTION

Figure 1:
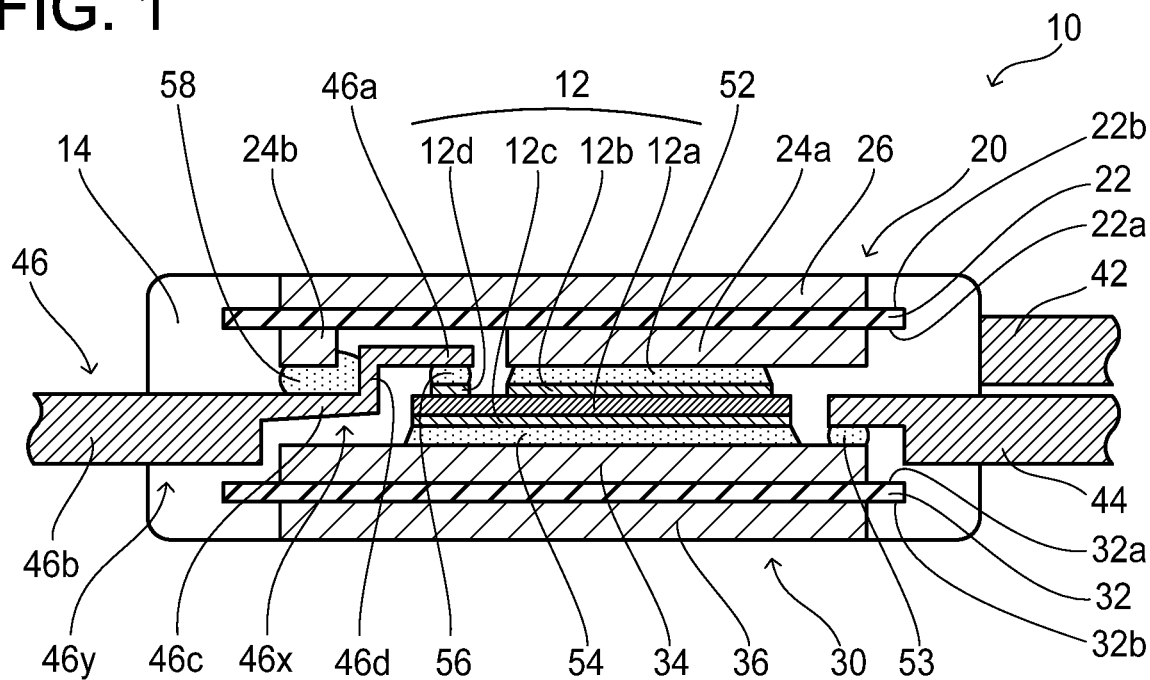
FIG. 1 is a cross-sectional view schematically showing a structure of a semiconductor device 10 according to an embodiment.

In an embodiment of the present technology, the semiconductor device may further include a second conductor film provided on the surface of the substrate at a location separated from the first conductor film. In this case, the intermediate portion of the external connection terminal may be joined to the second conductor film. According to such a configuration, the external connection terminal constituted of a conductor can be joined easily to the substrate constituted of an insulator. In another embodiment, the intermediate portion of the external connection terminal may be joined directly to the substrate.

In the above-described embodiment, the distance between the inner end portion of the external connection terminal and the substrate may be smaller than a thickness of the second conductor film. According to such a configuration, the semiconductor device can further be downsized.

In the above-described embodiment, at least a part of the inner end portion of the external connection terminal may be located between the first conductor film and the second conductor film in a direction parallel with the substrate. According to such a configuration, the semiconductor device can further be downsized.

In the above-described embodiment, the intermediate portion of the external connection terminal may be joined to the second conductor film via at least one joining layer (e.g., a solder layer). According to such a configuration, the external connection terminal and the substrate can be joined firmly to each other.

In an embodiment of the present technology, the external connection terminal may further include a transition portion located from the intermediate portion to the inner end portion. The transition portion may extend toward the substrate. According to such a configuration, when external force is applied to the outer end portion of the external connection terminal, the external connection terminal deforms, for example, by which the external force is less likely to be transferred to the inner end portion of the external connection terminal.

In the above-described embodiment, at least a part of the transition portion may be at least a part of the intermediate portion and may be joined to the substrate. According to such a configuration, the external connection terminal and the substrate can be joined firmly to each other.

In an embodiment of the present technology, the external connection terminal may include a first section with a first thickness extending along a longitudinal direction of the external connection terminal, and a second section with a second thickness extending along the longitudinal direction. The second thickness may be greater than the first thickness. In this case, the inner end portion may be located within the first section and the outer end portion may be located within the second section. According to such a configuration, the inner end portion of the external connection terminal has a relatively small thickness, so the semiconductor device can be downsized. On the other hand, the outer end portion of the external connection terminal has a relatively great thickness, so rigidity of the external connection terminal, which is connected to an external device, can be enhanced.

In the above-described embodiment, the second section of the external connection terminal may be opposed to the substrate without intervention of the first conductor film therebetween. In this case, a distance between the second section of the external connection terminal and the substrate may be smaller than a thickness of the first conductor film. Such a configuration can enhance the rigidity of the external connection terminal as well as suppress upsizing of the semiconductor device.

In an embodiment of the present technology, the semiconductor device may further include a second substrate constituted of an insulator and opposed to the substrate with intervention of the semiconductor chip therebetween, and a third conductor film provided on a surface of the second substrate and connected to a third electrode of the semiconductor chip. In this case, the second section of the external connection terminal may be opposed to the second substrate without intervention of the third conductor film, and a distance between the second section of the external connection terminal and the second substrate may be smaller than a thickness of the third conductor film. In the semiconductor device including a pair of substrates, such a configuration can enhance the rigidity of the external connection terminal as well as suppress upsizing of the semiconductor device.

Representative, non-limiting examples of the present disclosure will now be described in further detail with reference to the attached drawings. This detailed description is merely intended to teach a person of skill in the art further details for practicing aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Embodiment

With reference to the drawings, a semiconductor device 10 according to an embodiment will be described. The semiconductor device 10 is adopted in a power controller of an electric vehicle, and can configure at least a part of a power conversion circuit such as a converter or an inverter, for example. The electric vehicle herein widely means any vehicle including a motor that drives wheels. Examples of the electric vehicle include an electric vehicle charged with external power, a hybrid vehicle including an engine in addition to a motor, a fuel-cell vehicle powered by a fuel cell, and the like.

As shown in FIG. 1, the semiconductor device 10 includes a semiconductor chip 12 and an encapsulant 14 that encapsulates the semiconductor chip 12. The encapsulant 14 is constituted of an insulating material. The encapsulant 14 of the present embodiment is constituted of an encapsulating material such as an epoxy resin, although not particularly limited so. The encapsulant 14 has a substantially plate shape. The drawings attached to the present application omit hatching that should be added to a cross section of the encapsulant 14, for clearer illustration.

Figure 2:
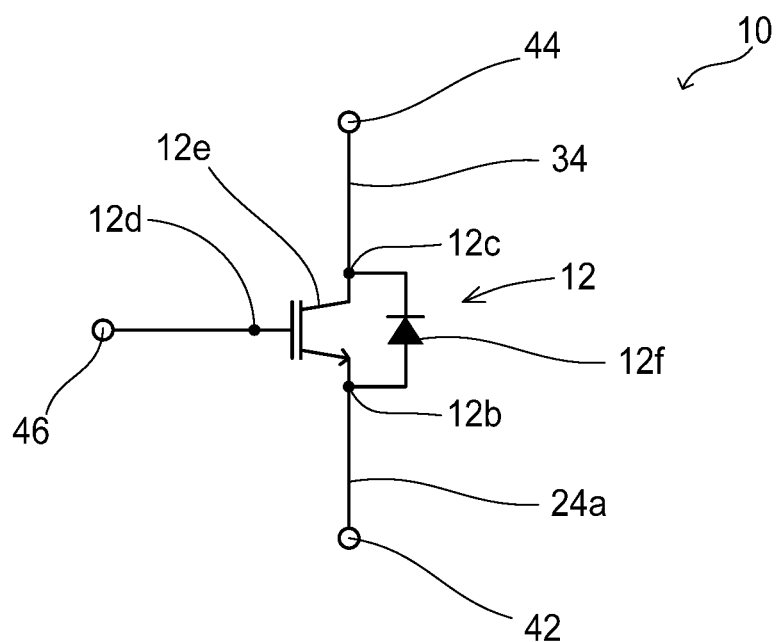
FIG. 2 is a circuit diagram of the semiconductor device 10.

As shown in FIGS. 1 and 2, the semiconductor chip 12 is a power semiconductor chip, and includes a semiconductor substrate 12a and a plurality of electrodes 12b, 12c, 12d. The plurality of electrodes 12b, 12c, 12d includes an upper electrode 12b and a lower electrode 12c that are connected to a power circuit and a plurality of signal electrodes 12d connected to a signal circuit. The semiconductor chip 12 is a switching element and is configured to electrically connect and disconnect the upper electrode 12b and the lower electrode 12c, although not particularly limited so. The upper electrode 12b and the plurality of signal electrodes 12d are located on one surface of the semiconductor substrate 12a, and the lower electrode 12c is located on another surface of the semiconductor substrate 12a. The plurality of electrodes 12b, 12c, 12d is constituted at least partly of metal such as aluminum, nickel, or gold, although not particularly limited so.

Here, the upper electrode 12b of the semiconductor chip 12 is an example of a "first electrode" in the present technology. The signal electrodes 12d of the semiconductor chip 12 are an example of a "second electrode" in the present technology. The lower electrode 12c of the semiconductor chip 12 is an example of a "third electrode" in the present technology.

The semiconductor chip 12 of the present embodiment includes an Insulated Gate Bipolar Transistor (IGBT) structure 12e, although not particularly limited so. The upper electrode 12b is connected to an emitter of the IGBT structure 12e, the lower electrode 12c is connected to a collector of the IGBT structure 12e, and the signal electrodes 12d are connected to a gate of the IGBT structure 12e. In addition, the semiconductor chip 12 includes a diode structure 12f connected in parallel with the IGBT structure 12e. The upper electrode 12b is connected to an anode of the diode structure 12f, and the lower electrode 12c is connected to a cathode of the diode structure 12f. In another embodiment, the semiconductor chip 12 may include a Metal-Oxide-Semiconductor Field-Effect Transistor (MOSFET) structure. In this case, the upper electrode 12b is connected to a source of the MOSFET structure, the lower electrode 12c is connected to a drain of the MOSFET structure, and the signal electrodes 12d are connected to a gate of the MOSFET structure.

As shown in FIGS. 1 to 4, the semiconductor device 10 further includes a first insulated circuit substrate 20. The first insulated circuit substrate 20 includes a first insulator substrate 22 constituted of an insulator, a plurality of inner conductor films 24a, 24b provided on one surface 22a of the first insulator substrate 22, and an outer conductor film 26 provided on another surface 22b of the first insulator substrate 22. The plurality of inner conductor films 24a, 24b includes a first inner conductor film 24a and second inner conductor films 24b, and they are located to be separated from each other. Each of the conductor films 24a, 24b, 26 is joined to the first insulator substrate 22 via a brazing material. The plurality of inner conductor films 24a, 24b is located within the encapsulant 14, and the outer conductor film 26 is exposed at a surface of the encapsulant 14. This allows the first insulated circuit substrate 20 to also function as a heat-dissipating plate that dissipates heat inside the encapsulant 14 (in particular, heat of the semiconductor chip 12) to an outside of the encapsulant 14.

The first inner conductor film 24a is opposed to the upper electrode 12b of the semiconductor chip 12. The upper electrode 12b of the semiconductor chip 12 is joined to the first inner conductor film 24a via a solder layer 52. The upper electrode 12b of the semiconductor chip 12 is thereby electrically connected to the first inner conductor film 24a. Moreover, the upper electrode 12b of the semiconductor chip 12 is also thermally connected to the first inner conductor film 24a. The upper electrode 12b and the first inner conductor film 24a may not be joined via the solder layer 52, and may be joined via a joining layer of another type having electrical conductivity. Moreover, another member, such as a conductor spacer, may be interposed between the upper electrode 12b and the first inner conductor film 24a, as needed.

Here, the first insulator substrate 22 is an example of a "substrate" in the present technology, the first inner conductor film 24a is an example of a "first conductor film" in the present technology, and the second inner conductor films 24b are an example of a "second conductor film" in the present technology.

The first insulator substrate 22 of the present embodiment is a ceramic substrate and is constituted of ceramic such as aluminum oxide, silicon nitride, or aluminum nitride. The inner conductor films 24a, 24b and the outer conductor film 26 are metal films and are each constituted of metal such as copper or aluminum. As described above, each of the inner conductor films 24a, 24b and the outer conductor film 26 is joined to the first insulator substrate 22 via a brazing material. This brazing material is an active metal brazing material in which active metal such as titanium is added to a brazing material mainly constituted of, for example, silver and copper. The first insulated circuit substrate 20 of this type is also termed an Active Metal Brazed Copper (AMC) substrate. However, the first insulated circuit substrate 20 is not limited to the AMC substrate, and a Direct Bonded Copper (DBC) substrate or a Direct Bonded Aluminum (DBA) substrate may be adopted for the first insulated circuit substrate 20, for example.

As an example, the first insulator substrate 22 may have a thickness of 0.1 to 1.0 millimeters, and each of the inner conductor films 24a, 24b and the outer conductor film 26 may have a thickness of 0.05 to 1.0 millimeters. Moreover, the thickness of each of the inner conductor films 24a, 24b and the outer conductor film 26 may be greater than the thickness of the first insulator substrate 22. The greater thicknesses the inner conductor films 24a, 24b and the outer conductor film 26 have, the greater heat capacities they have, by which a temperature rise during an operation of the semiconductor chip 12 can be suppressed effectively.

Figure 3:
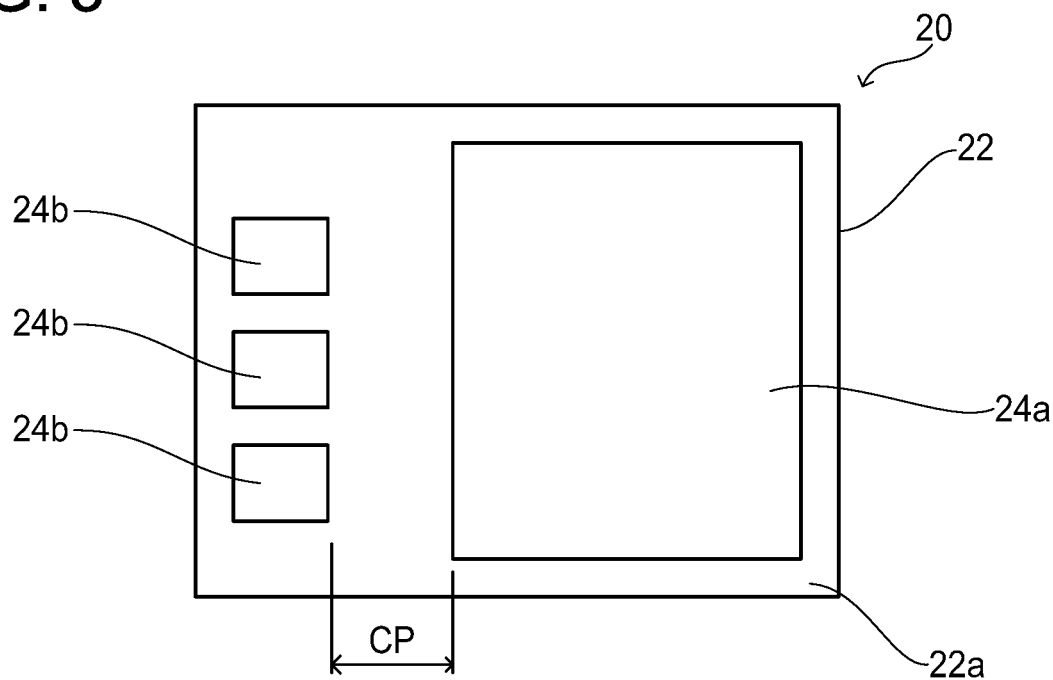
FIG. 3 is a plan view showing a first inner conductor film 24a and second inner conductor films 24b of a first insulated circuit substrate 20.
Figure 4:
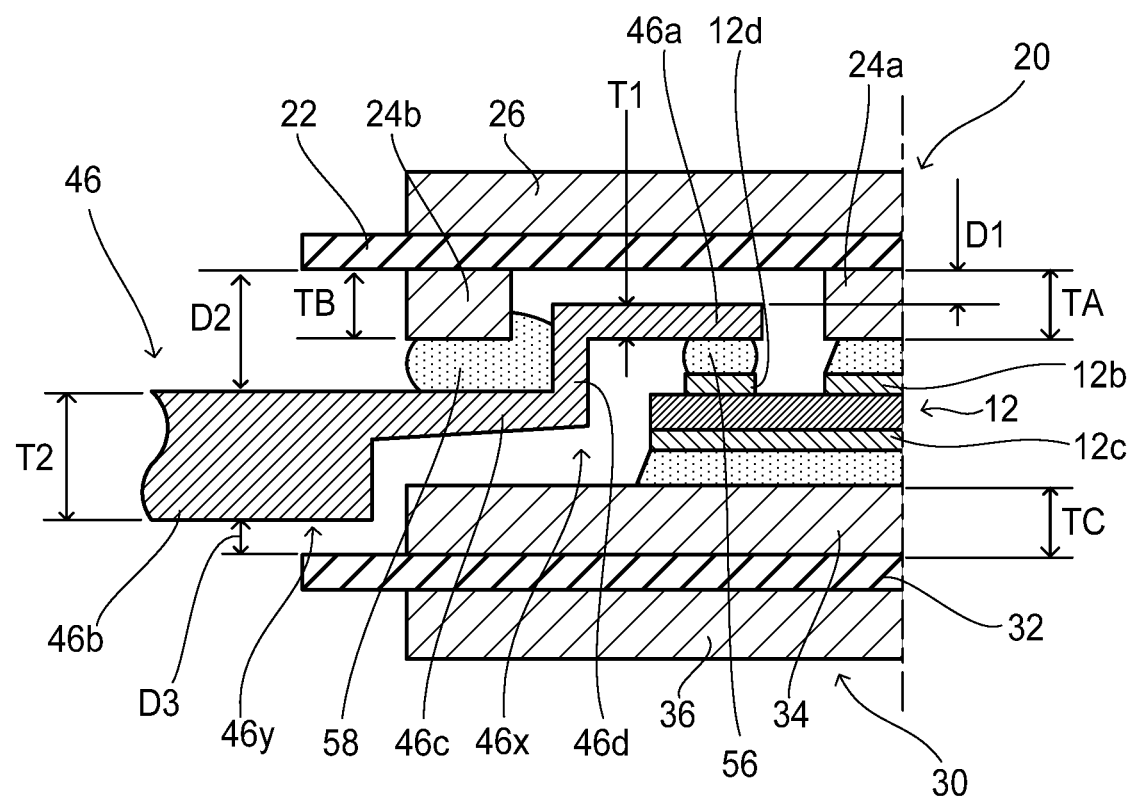
FIGS. 4 to 7 are diagrams each showing a main part of the semiconductor device 10 in an enlarged manner.

As shown in FIGS. 1, 3, and 4, the semiconductor device 10 further includes a second insulated circuit substrate 30. The second insulated circuit substrate 30 is opposed to the first insulated circuit substrate 20 with intervention of the semiconductor chip 12 therebetween. The second insulated circuit substrate 30 includes a second insulator substrate 32 constitute of an insulator, an inner conductor film 34 provided on one surface 32a of the second insulator substrate 32, and an outer conductor film 36 provided on another surface 32b of the second insulator substrate 32. Each of the conductor films 34, 36 is joined to the second insulator substrate 32 via a brazing material. The inner conductor film 34 is located within the encapsulant 14, and the outer conductor film 36 is exposed at a surface of the encapsulant 14. This allows the second insulated circuit substrate 30 to also function as a heat-dissipating plate that dissipates heat inside the encapsulant 14 (in particular, heat of the semiconductor chip 12) to the outside of the encapsulant 14.

The inner conductor film 34 of the second insulated circuit substrate 30 is opposed to the lower electrode 12c of the semiconductor chip 12. The lower electrode 12c of the semiconductor chip 12 is joined to the inner conductor film 34 via a solder layer 54. The lower electrode 12c of the semiconductor chip 12 is thereby electrically connected to the inner conductor film 34 of the second insulated circuit substrate 30. Moreover, the lower electrode 12c of the semiconductor chip 12 is also thermally connected to the inner conductor film 34 of the second insulated circuit substrate 30. The lower electrode 12c and the inner conductor film 34 may not be joined via the solder layer 54, and may be joined via a joining layer of another type having electrical conductivity. Moreover, another member, such as a conductor spacer, may be interposed between the lower electrode 12c and the inner conductor film 34, as needed.

Similarly to the first insulator substrate 22, the second insulator substrate 32 is a ceramic substrate, and the inner conductor film 34 and the outer conductor film 36 of the second insulated circuit substrate 30 are metal films. In the second insulated circuit substrate 30 as well, each of the inner conductor film 34 and the outer conductor film 36 is joined to the second insulator substrate 32 via an active metal brazing material, although not particularly limited so. In other words, the second insulated circuit substrate 30 also has a so-called Active Metal Brazed Copper (AMC) substrate structure. However, similarly to the first insulated circuit substrate 20, the second insulated circuit substrate 30 is not limited to the AMC substrate, and a Direct Bonded Copper (DBC) substrate or a Direct Bonded Aluminum (DBA) substrate may be adopted for the second insulated circuit substrate 30, for example.

As an example, the second insulator substrate 32 may have a thickness of 0.1 to 1.0 millimeters, and each of the inner conductor film 34 and the outer conductor film 36 may have a thickness of 0.05 to 1.0 millimeters. Moreover, the thickness of each of the inner conductor film 34 and the outer conductor film 36 may be greater than the thickness of the second insulator substrate 32. The greater thicknesses the inner conductor film 34 and the outer conductor film 36 have, the greater heat capacities they have, by which a temperature rise during the operation of the semiconductor chip 12 can be suppressed effectively. Here, the first and second insulated circuit substrates 20, 30 may be the same to or different from each other in materials and thicknesses of the insulator substrates 22, 32. Similarly, the first and second insulated circuit substrates 20, 30 may be the same to or different form each other in materials and thicknesses of the inner conductor films 24a, 24b, 34, and in materials and thicknesses of the outer conductor films 26, 36.

As shown in FIGS. 1, 3, and 4, the semiconductor device 10 further includes a plurality of external connection terminals 42, 44, 46. Each of the external connection terminals 42, 44, 46 is constituted of a conductor such as metal (e.g., copper), and extends across inside and outside of the encapsulant 14. The plurality of external connection terminals 42, 44, 46 includes a first power terminal 42, a second power terminal 44, and a plurality of signal terminals 46. The first power terminal 42 is joined to the first inner conductor film 24a of the first insulated circuit substrate 20 at a location that is not shown. The first power terminal 42 is thereby electrically connected to the upper electrode 12b of the semiconductor chip 12 via the first inner conductor film 24a of the first insulated circuit substrate 20. On the other hand, the second power terminal 44 is joined to the inner conductor film 34 of the second insulated circuit substrate 30 via a solder layer 53. The second power terminal 44 is thereby electrically connected to the lower electrode 12c of the semiconductor chip 12 via the inner conductor film 34 of the second insulated circuit substrate 30.

Each of the signal terminals 46 includes an inner end portion 46a located within the encapsulant 14 and an outer end portion 46b located outside the encapsulant 14, and extends from the inner end portion 46a to the outer end portion 46b. The outer end portions 46b are connected to an external device such as a control circuit substrate that controls an operation of the semiconductor device 10. Each of the inner end portions 46a is located between the first insulator substrate 22 and the semiconductor chip 12, and is joined to corresponding one of the signal electrodes 12d of the semiconductor chip 12 via a solder layer 56. The signal terminals 46 are thereby electrically connected to the signal electrodes 12d of the semiconductor chip 12. The signal terminals 46 and the signal electrodes 12d may not be joined via the solder layers 56, and may be joined via joining layers of another type having electrical conductivity. Moreover, other members, such as conductor spacers, may be interposed between the signal terminals 46 and the signal electrodes 12d, as needed. Here, the signal terminals 46 are an example of an "external connection terminal" in the present technology.

Each of the signal terminals 46 further includes an intermediate portion 46c located between the inner end portion 46a and the outer end portion 46b. Each of the intermediate portions 46c of the signal terminals 46 is joined to corresponding one of the second inner conductor films 24b on the first insulator substrate 22 via a solder layer 58. The intermediate portions 46c and the second inner conductor films 24b may not be joined via the solder layers 58, and may be joined via joining layers of another type. In this case, the joining layers may not have electrical conductivity. Moreover, the intermediate portions 46c of the signal terminals 46 may be joined directly to the first insulator substrate 22, not via the second inner conductor films 24b nor the solder layers 58. No limitation is placed on specific structures for joining the intermediate portions 46c and the second inner conductor films 24b to each other.

In the semiconductor device 10 of the present embodiment, the inner end portions 46a of the signal terminals 46 are located between the first insulator substrate 22 and the semiconductor chip 12. The inner end portions 46a of the signal terminals 46 can therefore be connected to the signal electrodes 12d of the semiconductor chip 12 directly (or via small spacers or the like). The semiconductor device 10 can thereby be downsized. Moreover, the intermediate portions 46c of the signal terminals 46 are joined to the one surface 22a of the first insulator substrate 22. According to such a configuration, even when external force is applied to at least one of the outer end portions 46b of the signal terminals 46, the external force is less likely to be transferred to the inner end portion 46a of the signal terminal 46. Therefore, damage to the semiconductor chip 12 can be avoided or suppressed, for example.

As described above, the intermediate portions 46c of the signal terminals 46 are electrically connected to the second inner conductor films 24b on the first insulator substrate 22. The second inner conductor films 24b thus need to be insulated from the first inner conductor film 24a adjacent thereto. For this, a sufficient creepage distance CP (see FIG. 3) needs to be provided on the first insulator substrate 22, between the first inner conductor film 24a and the second inner conductor films 24b. In this regard, the second inner conductor films 24b are joined not to the inner end portions 46a of the signal terminals 46, but to the intermediate portions 46c of the signal terminals 46. Therefore, the second inner conductor films 24b can be provided at locations separated from the first inner conductor film 24a, and the creepage distance CP, which is relatively great, can be provided between the first inner conductor film 24a and the second inner conductor films 24b.

In the semiconductor device 10 of the present embodiment, a distance D2 between the intermediate portions 46c of the signal terminals 46 and the first insulator substrate 22 is greater than a distance D1 between the inner end portions 46a of the signal terminals 46 and the first insulator substrate 22 (see FIG. 4). As such, the relatively great distance D2 between the intermediate portions 46c of the signal terminals 46 and the first insulator substrate 22 facilitates designing of a structure for joining the intermediate portions 46c and the first insulator substrate 22 to each other, by which they can be joined with sufficient strength. In contrast to this, the inner end portions 46a of the signal terminals 46 are located between the first insulator substrate 22 and the semiconductor chip 12, so the relatively small distance between the inner end portions 46a and the first insulator substrate 22 enables downsizing of the semiconductor device 10.

In the semiconductor device 10 of the present embodiment, the distance D1 between the inner end portions 46a of the signal terminals 46 and the first insulator substrate 22 is smaller than a thickness TA of the first inner conductor film 24a and than a thickness TB of the second inner conductor films 24b (see FIG. 4). In addition, the inner end portions 46a of the signal terminals 46 are at least partially located between the first inner conductor film 24a and the second inner conductor films 24b in a direction parallel with the first insulator substrate 22. According to these configurations, the semiconductor device 10 can further be downsized. Here, the thickness TA of the first inner conductor film 24a and the thickness TB of the second inner conductor films 24b may be equal to or different from each other.

In the semiconductor device 10 of the present embodiment, each of the signal terminals 46 includes a transition portion 46d located from the intermediate portion 46c to the inner end portion 46a (see FIG. 4). In the transition portion 46d, the signal terminal 46 extends toward the first insulator substrate 22 along a direction from the intermediate portion 46c to the inner end portion 46a, not parallel with the first insulated substrate 22. According to such a configuration, when external force is applied to at least one of the outer end portions 46b of the signal terminals 46, the signal terminal 46 likely to deform at its transition portion 46d. The external force is thereby less likely to be transferred to the inner end portion 46a of the signal terminal 46, so damage to the semiconductor chip 12 can be avoided or suppressed more effectively, for example.

In the semiconductor device 10 of the present embodiment, each signal terminal 46 is configured such that least a part of the transition portion 46d is joined to the second inner conductor film 24b via the solder layer 58 (see FIG. 4). In other words, at least a part of the transition portion 46d is also a part of the intermediate portion 46c joined to the first insulator substrate 22. According to such a configuration, the signal terminals 46 are joined to the first insulator substrate 22 from a plurality of directions, so the signal terminals 46 and the first insulator substrate 22 can be joined firmly to each other.

In the semiconductor device 10 of the present embodiment, each of the signal terminals 46 includes a first section 46x with a first thickness T1 extending along a longitudinal direction of the signal terminals 46, and a second section 46y with a second thickness T2 extending along the longitudinal direction (see FIG. 4). The second thickness T2 is greater than the first thickness T1. The inner end portions 46a of the signal terminals 46 are located within the first sections 46x and the outer end portions 46b of the signal terminals 46 are located within the second sections 46y. According to such a configuration, the inner end portions 46a of the signal terminals 46 have the relatively small thickness, so the semiconductor device 10 can be downsized. On the other hand, the outer end portions 46b of the signal terminals 46 have the relatively great thickness, so rigidity of the signal terminals 46, which are connected to the external device, can be enhanced.

In the semiconductor device 10 of the present embodiment, the second sections 46y of the signal terminals 46 protrude toward the second insulated circuit substrate 30. In particular, the second sections 46y of the signal terminals 46 are opposed to the second insulator substrate 32 without intervention of the inner conductor film 34 of the second insulated circuit substrate 30 therebetween. A distance D3 between the second sections 46y of the signal terminals 46 and the second insulator substrate 32 is smaller than a thickness TC of the inner conductor film 34 of the second insulated circuit substrate 30 (see FIG. 4). Therefore, the second sections 46y of the signal terminals 46 are adjacent to the inner conductor film 34 of the second insulated circuit substrate 30 in a direction parallel with the second insulator substrate 32. Such a configuration can enhance the rigidity of the signal terminals 46 as well as suppress upsizing of the semiconductor device 10.

Next, with reference to FIGS. 5 to 7, a method of manufacturing the semiconductor device 10 will be described. This manufacturing method mainly includes a first reflow step and a second reflow step. In the first reflow step, the semiconductor chip 12 is joined to the second insulated circuit substrate 30, and simultaneously, the signal terminals 46 are connected to the semiconductor chip 12. The first reflow step is not limited as to its specific aspects. Although not shown, in the first reflow step, the second power terminal 44 is also joined to the inner conductor film 34 of the second insulated circuit substrate 30. Here, the signal terminals 46 may be prepared in the form of a lead frame that integrally includes the first power terminal 42 and the second power terminal 44.

Figure 5:
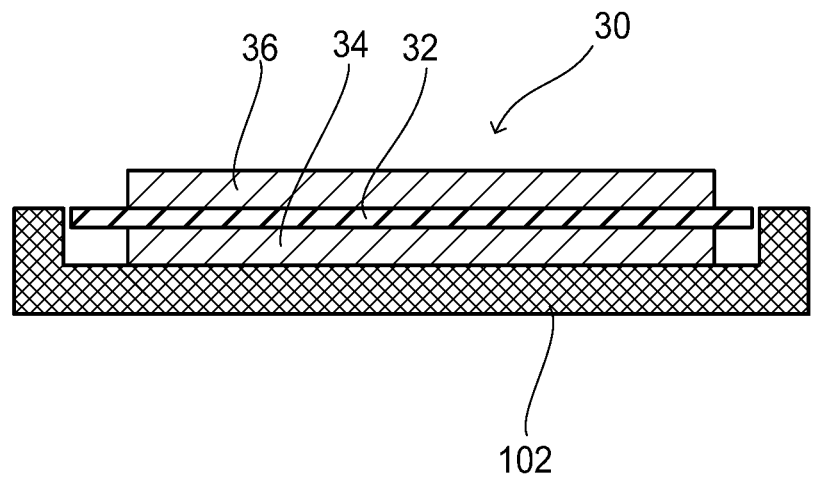
Figure 6:
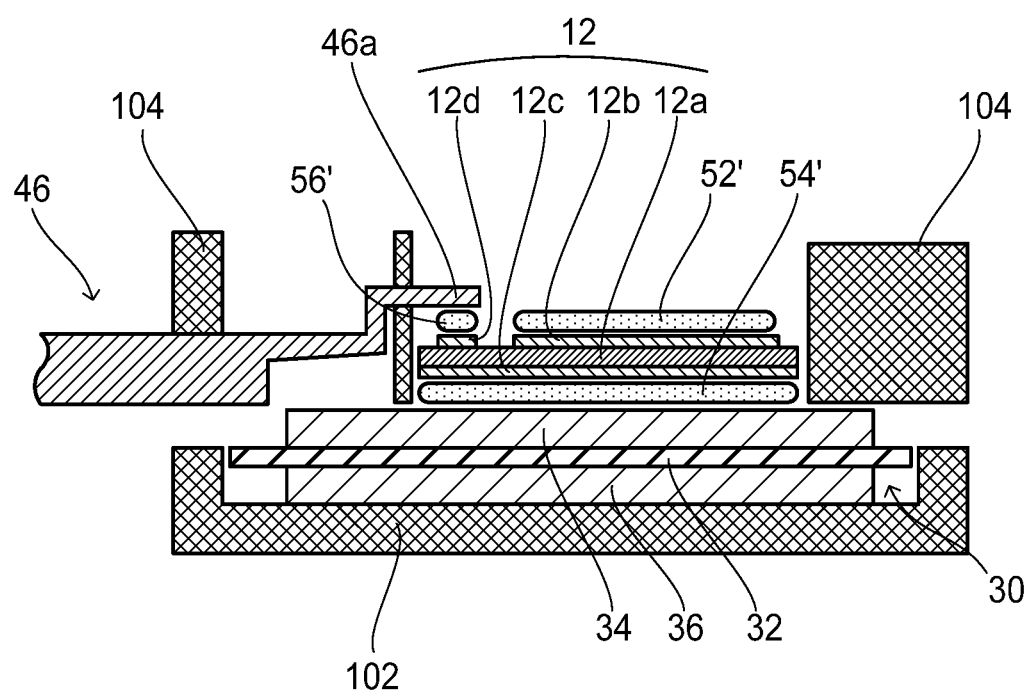

In the present embodiment, as shown in FIG. 5, the second insulated circuit substrate 30 is firstly disposed on a first jig 102. Successively, as shown in FIG. 6, a second jig 104 is further used to dispose the semiconductor chip 12 on the second insulated circuit substrate 30 and align the signal terminals 46 relative to the semiconductor chip 12. At this time, a solder material 54' is disposed between the inner conductor film 34 of the second insulated circuit substrate 30 and the lower electrode 12c of the semiconductor chip 12. Moreover, a solder material 52' is disposed on the upper electrode 12b of the semiconductor chip 12. A solder material 56' is disposed between the signal electrodes 12d of the semiconductor chip 12 and the inner end portions 46a of the signal terminals 46.

Subsequently, these solder materials 52', 54', 56' are melted and solidified again using a reflow furnace. Thereby, as shown in FIG. 7, the lower electrode 12c of the semiconductor chip 12 is joined to the inner conductor film 34 of the second insulated circuit substrate 30 via the solder layer 54. Moreover, the inner end portions 46a of the signal terminals 46 are joined to the signal electrodes 12d of the semiconductor chip 12 via the solder layers 56. On the other hand, the solder layer 52, which will be used in the second reflow step, is formed on the upper electrode 12b of the semiconductor chip 12.

In the above-described first reflow step, when the inner end portions 46a of the signal terminals 46 are connected to the signal electrodes 12d of the semiconductor chip 12, neither the conductor film provided on the first insulated circuit substrate 20 nor a bonding wire needs to be interposed therebetween. Therefore, the semiconductor chip 12 and the signal terminals 46 can be aligned directly relative to each other. Moreover, at the time of the alignment, neither the semiconductor chip 12 nor the signal electrodes 12d is masked by the first insulated circuit substrate 20. Accordingly, the semiconductor chip 12 and the signal terminals 46 can be aligned easily by, for example, a single jig.

Figure 7:
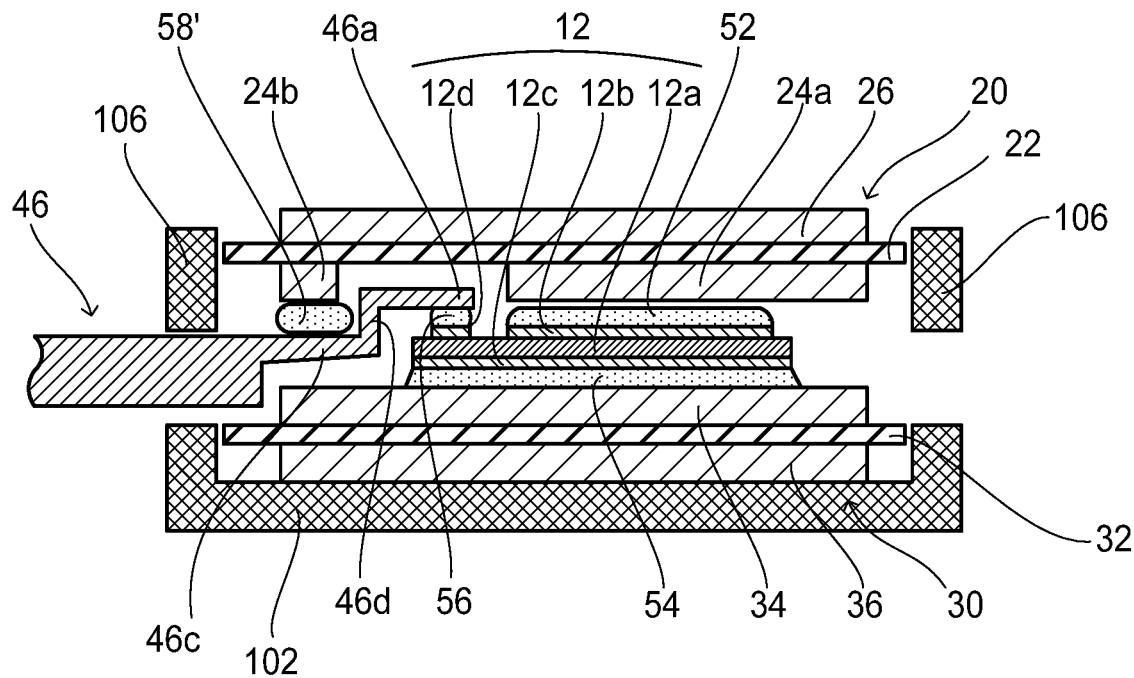

Next, in the second reflow step, as shown in FIG. 7, the first insulated circuit substrate is joined to the semiconductor chip 12 and the signal terminals 46. The second reflow step is not limited as to its specific aspects, either. In the present embodiment, the first insulated circuit substrate 20 is firstly disposed on the semiconductor chip 12 and the signal terminals 46. At this time, the first inner conductor film 24a is arranged to be opposed to the upper electrode 12b of the semiconductor chip 12. The second inner conductor films 24b are arranged to be opposed to the intermediate portions 46c of the signal terminals 46 with intervention of a solder material 58' therebetween.

Subsequently, the solder layer 52 and the solder material 58' are melted and solidified again using the reflow furnace. The upper electrode 12b of the semiconductor chip 12 is thereby joined to the first inner conductor film 24a of the first insulated circuit substrate 20 via the solder layer 52. The intermediate portions 46c of the signal terminals 46 are joined to the second inner conductor films 24b of the first insulated circuit substrate 20 via the solder layers 58 (see FIGS. 1 and 4). Although not shown, in the second reflow step, the first power terminal 42 is also joined to the first inner conductor film 24a of the first insulated circuit substrate 20.

The second reflow step is followed, as needed, by other steps such as a step of molding the encapsulant 14 and a step of cutting away a tie bar of the lead frame. The semiconductor device 10 is thereby completed.

Figure 8:
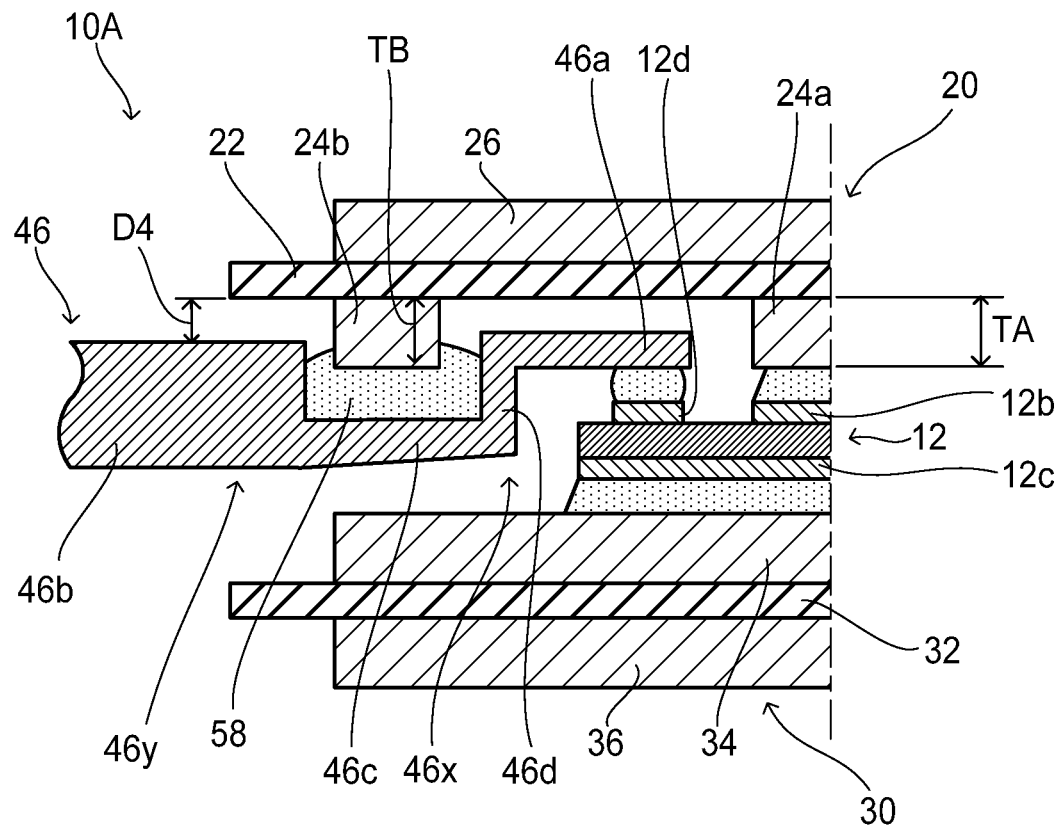
FIG. 8 is a cross-sectional view showing a main part of a semiconductor device 10A according to a variant.

FIG. 8 shows a main part of a semiconductor device 10A of a variant. As compared to the above-described semiconductor device 10, this semiconductor device 10A is modified in its configuration of the signal terminals 46. Specifically, in the semiconductor device 10A, the second sections 46y of the signal terminals 46 protrude not toward the second insulated circuit substrate 30, but toward the first insulated circuit substrate 20. In particular, the second sections 46y of the signal terminals 46 are opposed to the first insulator substrate 22 without intervention of the first inner conductor film 24a and the second inner conductor films 24b therebetween. A distance D4 between the second sections 46y of the signal terminals 46 and the first insulator substrate 22 is smaller than the thickness TA of the first inner conductor film 24a and than the thickness TB of the second inner conductor films 24b. Therefore, the second sections 46y of the signal terminals 46 are adjacent to the second inner conductor films 24b in the direction parallel with the first insulator substrate 22. Such a configuration can enhance the rigidity of the signal terminals 46 as well as suppress upsizing of the semiconductor device 10A.

In addition, in the above-described variant, each signal terminal 46 is configured such that a part of the second section 46y of the signal terminal 46 is joined to the second inner conductor film 24b via the solder layer 58. As such, joining not only the intermediate portions 46c of the signal terminals 46 but also a part of the second section 46y of the signal terminal 46 to the first insulator substrate 22 allows the signal terminals 46 to be joined firmly to the first insulator substrate 22.

Figure 9:
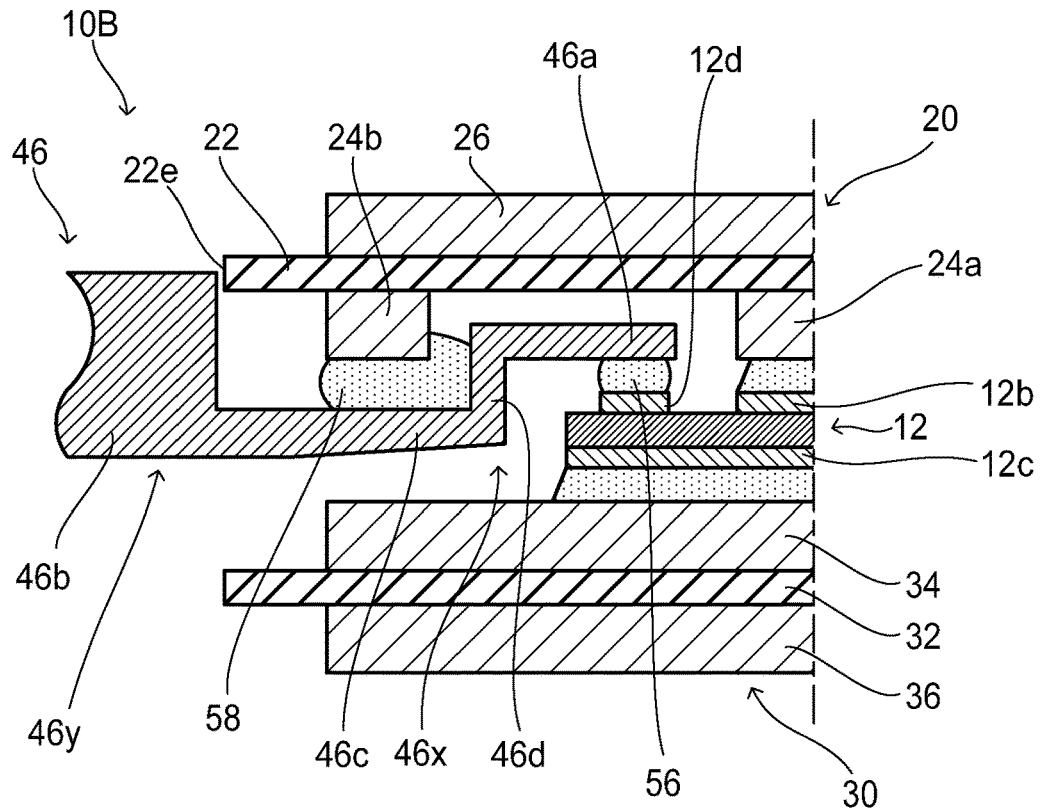
FIG. 9 is a cross-sectional view showing a main part of a semiconductor device 10B according to another variant.

FIG. 9 shows a main part of a semiconductor device 10B of another variant. In this semiconductor device 10B, the second sections 46y of the signal terminals 46 protrude toward the first insulated circuit substrate 20, similarly to the semiconductor device 10A shown in FIG. 8. However, the second sections 46y of the signal terminals 46 are located outside the first insulator substrate 22, and are not opposed to the first insulator substrate 22. Moreover, the second sections 46y of the signal terminals 46 have a greater thickness and are opposed to an outer peripheral edge 22e of the first insulator substrate 22 in the direction parallel with the first insulator substrate 22. According to such a configuration, strength of the signal terminals 46 can further be enhanced. Moreover, when the first insulated circuit substrate 20 is to be assembled to the intermediate portions 46c of the signal terminals 46 (e.g., in the above-described second reflow step), the second sections 46y of the signal terminals 46 can be used to align the first insulated circuit substrate 20.

Figure 10:
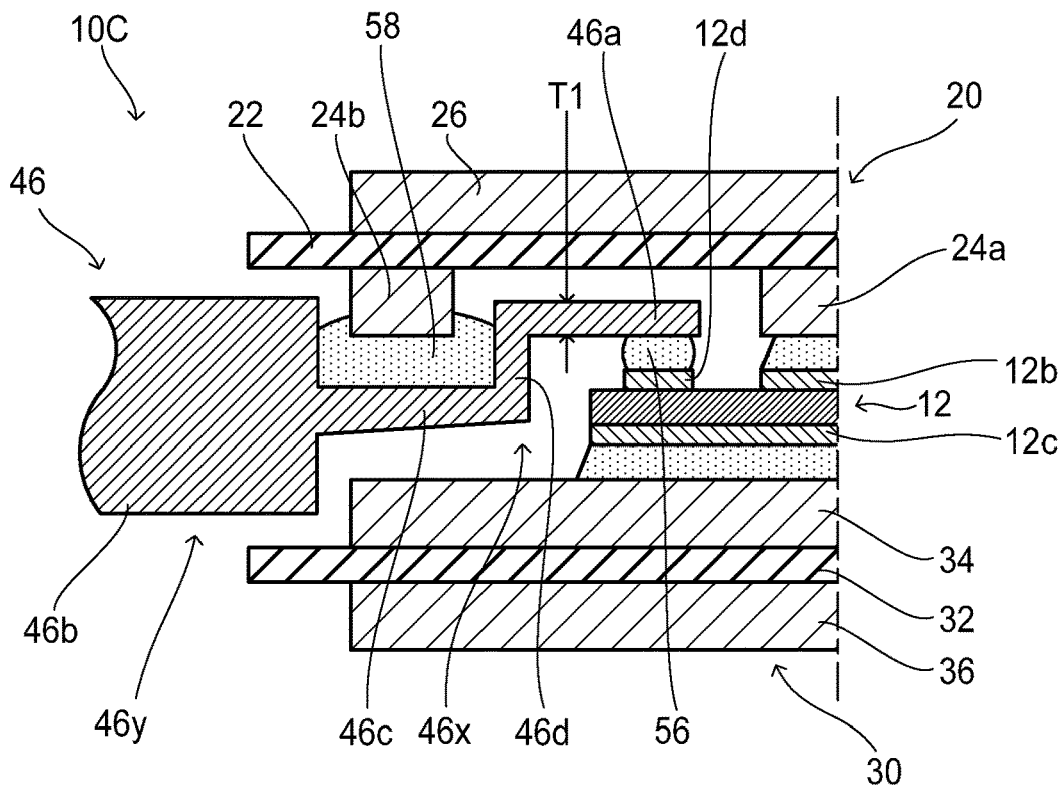
FIG. 10 is a cross-sectional view showing a main part of a semiconductor device 10C according to still another variant.

FIG. 10 shows a main part of a semiconductor device 10C of still another variant. In this semiconductor device 10C, the second sections 46y of the signal terminals 46 protrude both toward the first insulated circuit substrate 20 and toward the second insulated circuit substrate 30. According to such a configuration, the second sections 46y of the signal terminals 46 are allowed to have a much greater thickness, and strength of the signal terminals 46 can be further enhanced.

The configurations of the above-described semiconductor devices 10 and 10A to 10C can be modified variously. For example, each of the semiconductor devices 10 and 10A to 10C may include a plurality of the semiconductor chips 12, and is not limited to including the single semiconductor chip 12. Moreover, the present disclosure has described the example in which the structure of the external connection terminal according to the present technology is adopted to the signal terminals 46, however, the same structure can be adopted to other terminals such as the power terminals 42, 44.

What is claimed is:

1. A semiconductor device, comprising:
    a substrate constituted of an insulator,
    a first conductor film provided on a surface of the substrate;
    a semiconductor chip comprising a first electrode and a second electrode, the first electrode being connected to the first conductor film; and
    an external connection terminal comprising an inner end portion and an outer end portion, the inner end portion being located between the substrate and the semiconductor chip and being connected to the second electrode,
    wherein the external connection terminal further comprises an intermediate portion, the intermediate portion being located between the inner end portion and the outer end portion and being joined to the surface of the substrate, and a distance between the intermediate portion of the external connection terminal and the substrate is greater than a distance between the inner end portion of the external connection terminal and the substrate.

2. The semiconductor device according to claim 1, further comprising a second conductor film provided on the surface of the substrate at a location separated from the first conductor film, wherein the intermediate portion of the external connection terminal is joined to the second conductor film.

3. The semiconductor device according to claim 2, wherein the distance between the inner end portion of the external connection terminal and the substrate is smaller than a thickness of the second conductor film.

4. The semiconductor device according to claim 2, wherein at least a part of the intermediate portion of the external connection terminal is located between the first conductor film and the second conductor film in a direction parallel with the substrate.

5. The semiconductor device according to claim 2, wherein the intermediate portion of the external connection terminal is joined to the second conductor film via at least one joining layer.

6. The semiconductor device according to claim 1, wherein the external connection terminal further comprises a transition portion located from the intermediate portion to the inner end portion, the transition portion extending toward the substrate.

7. The semiconductor device according to claim 6, wherein at least a part of the transition portion is at least a part of the intermediate portion and is joined to the substrate.

8. The semiconductor device according to claim 1, wherein the external connection terminal comprises a first section with a first thickness extending along a longitudinal direction of the external connection terminal, and a second section with a second thickness extending along the longitudinal direction, the second thickness being greater than the first thickness, and the inner end portion is located within the first section and the outer end portion is located within the second section.

9. The semiconductor device according to claim 8, wherein the second section of the external connection terminal is opposed to the substrate without intervention of the first conductor film therebetween, and a distance between the second section of the external connection terminal and the substrate is smaller than a thickness of the first conductor film.

10. The semiconductor device according to claim 8, further comprising:

a second substrate constituted of an insulator and opposed to the substrate with intervention of the semiconductor chip therebetween; and a third conductor film provided on a surface of the second substrate and connected to a third electrode of the semiconductor chip, wherein the second section of the external connection terminal is opposed to the second substrate without intervention of the third conductor film, and a distance between the second section of the external connection terminal and the second substrate is smaller than a thickness of the third conductor film.

11. A method of manufacturing a semiconductor device, the method comprising:

connecting an inner end portion of an external connection terminal to a second electrode of a semiconductor chip; and connecting a first conductor film provided on a surface of a substrate constituted of an insulator to a first electrode of the semiconductor chip and simultaneously joining the surface of the substrate to an intermediate portion located between the inner end portion and an outer end portion of the external connection terminal, wherein the inner end portion of the external connection terminal connected to the second electrode is located between the substrate and the semiconductor chip, and a distance between the intermediate portion of the external connection terminal and the substrate is greater than a distance between the inner end portion of the external connection terminal and the substrate.

* * * * *